(12) United States Patent
Lee (10) Patent No.: US 7,808,066 B2
(45) Date of Patent: Oct. 5, 2010

(54) IMAGE SENSOR AND METHOD OF MANUFACTURING THE SAME

(75) Inventor: Kang-Hyun Lee, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 73 days.

(21) Appl. No.: 12/249,933

(22) Filed: Oct. 12, 2008

(65) Prior Publication Data
US 2009/0134485 A1     May 28, 2009

(30) Foreign Application Priority Data
Nov. 28, 2007    (KR) ...................... 10-2007-0121897

(51) Int. Cl.
    *H01L 31/113* (2006.01)
(52) U.S. Cl. .......... 257/443; 257/E27.13; 257/E27.131; 257/E27.132
(58) Field of Classification Search ............ 257/E27.13, 257/E27.131, E27.132, E27.133, 443, 444, 257/448, 290–294
See application file for complete search history.

(56) References Cited

U.S. PATENT DOCUMENTS 5,936,261 A    8/1999  Ma et al.
6,600,172 B1   7/2003  Matsuno
6,759,262 B2   7/2004  Theil et al.
2008/0203452 A1*  8/2008  Moon et al. ................. 257/292

FOREIGN PATENT DOCUMENTS

JP    2000-156488      6/2000
KR    10-2001-0061959  7/2001

* cited by examiner

*Primary Examiner*—Zandra Smith
*Assistant Examiner*—Paul E Patton
(74) *Attorney, Agent, or Firm*—Sherr & Vaughn, PLLC

(57) ABSTRACT

An image sensor includes a semiconductor substrate including a pixel region and a peripheral circuit region; interlayer insulating films including metal wires arranged on the pixel region and the peripheral circuit region; and a photodiode and an upper electrode disposed on the interlayer insulating film of the pixel region. Further, the image sensor includes a protective layer disposed on the semiconductor substrate including the upper electrode and the interlayer insulating film of the peripheral circuit region and having a sloping portion in a region corresponding to the sidewall of the photodiode; via holes disposed on the protective layer so as to selectively expose the upper electrode and the metal wires of the peripheral circuit region; and upper wiring disposed on the protective layer including the via holes.

12 Claims, 11 Drawing Sheets

IMAGE SENSOR AND METHOD OF MANUFACTURING THE SAME

The present application claims priority under 35 U.S.C. §119 to Korean Patent Application 10-2007-0121897 (filed on Nov. 28, 2007), the contents of which are incorporated in its entirety.

BACKGROUND

An image sensor is a semiconductor device that converts optical images to electrical signals. Image sensors can be classified into a charge coupled device (CCD) image sensor or a CMOS image sensor. The CMOS image sensor sequentially detects electrical signals of each unit pixel using the switching mode to realize images by forming photodiodes and MOS transistors in the unit pixels. Such a CMOS image sensor has a structure in which photodiode areas for receiving and converting a light signal into an electrical signal and transistors for processing this electrical signal are horizontally arranged on and/or over a semiconductor substrate. By a horizontal CMOS image sensor, photodiodes and transistors are horizontally formed adjacent to each other on and/or over a substrate, thus requiring additional areas for forming photodiodes.

SUMMARY

Embodiments relate to an image sensor and a method for manufacturing the same that can provide vertical integration of transistor circuits and photodiodes.

Embodiments relate to an image sensor and a method for manufacturing the same that maximizes both resolution and sensitivity.

Embodiments relate to an image sensor and a method for manufacturing the same that can obtain 100% fill factors by vertical integration of transistor circuits and photodiodes.

Embodiments relate to an image sensor and a method for manufacturing the same that can maximize sensitivity with the same pixel size by vertical integration.

Embodiments relate to an image sensor and a method for manufacturing the same that has complicated circuitry with respective unit pixels without a reduction in sensitivity.

Embodiments relate to an image sensor and a method for manufacturing the same that maximizes light sensitivity by increasing the surface area of photodiodes in unit pixels when implementing the unit pixels of the photodiodes.

Embodiments relate to an image sensor and a method for manufacturing the same that enhances subsequent process steps while employing a vertical type photodiode.

Embodiments relate to an image sensor that may include at least one of the following: a semiconductor substrate including a pixel region and a peripheral circuit region; interlayer insulating films including metal wires arranged on and/or over the pixel region and the peripheral circuit region; a photodiode and an upper electrode disposed on and/or over the interlayer insulating film of the pixel region; a protective layer disposed on and/or over the semiconductor substrate including the upper electrode and the interlayer insulating film of the peripheral circuit region and having a sloping portion in a region corresponding to the sidewall of the photodiode; via holes disposed on and/or over the protective layer so as to selectively expose the upper electrode and the metal wires of the peripheral circuit region; and upper wiring disposed on and/or over the protective layer including the via holes.

Embodiments relate to an image sensor that may include at least one of the following: a semiconductor substrate including a pixel region and a peripheral circuit region; interlayer insulating films including lower metal wiring formed over the pixel region and the peripheral circuit region; lower electrodes formed in the pixel region over the interlayer insulating film and electrically connected to the lower metal wiring formed in the pixel region; a photodiode formed in the pixel region over the interlayer insulating film and the lower electrodes; an upper electrode formed in the pixel region over the photodiode; a protective layer formed in the pixel region and the peripheral circuit region over the semiconductor substrate including the upper electrode and the interlayer insulating film, the protective layer having a sloped portion in a region corresponding to the sidewall of the photodiode; via holes formed in the protective layer to expose the upper electrode and the lower metal wiring in the peripheral circuit region; and upper wiring formed over the protective layer including the via holes.

Embodiments relate to a method for manufacturing an image sensor that may include at least one of the following steps: forming a pixel region and a peripheral circuit region on and/or over a semiconductor substrate; and then forming interlayer insulating films including a plurality of metal wires on and/or over the pixel region and the peripheral circuit region; and then forming a photodiode and an upper electrode on and/or over the interlayer insulating film of the pixel region; and then forming a protective layer on and/or over the semiconductor substrate including the upper electrode and the interlayer insulating film of the peripheral circuit region so as to have a sloping portion in a region corresponding to a sidewall of the photodiode; and then forming via holes in the protective layer so as to selectively expose the upper electrode and the metal wires of the peripheral circuit region; and then forming upper wiring on and/or over the protective layer including the via holes.

Embodiments relate to an apparatus that may include at least one of the following: a semiconductor substrate having a pixel region and a peripheral circuit region; an interlayer insulating film formed in the pixel region and the peripheral circuit region; lower metal wiring formed extending through the interlayer insulating film in the pixel region and the peripheral circuit region; upper electrodes formed in the pixel region over the interlayer insulating film and electrically connected to the lower metal wiring; a photodiode formed in the pixel region over the interlayer insulating film and the upper electrode, the photodiode including an intrinsic layer formed over the upper electrodes and a conducting layer formed over the intrinsic layer; a protective layer formed in the pixel region over the upper electrode and in the peripheral circuit region over the interlayer insulating film; a first via hole formed in the protective layer exposing a portion of the upper electrode; a second via hole formed in the protective layer exposing the lower metal wiring in the peripheral circuit region; and upper wiring formed over the protective layer including the via holes and electrically connected to the upper electrode and the lower metal wiring.

Embodiments relate to a method for manufacturing an image sensor that may include at least one of the following steps: providing a semiconductor substrate having a pixel region and a peripheral circuit region; and then forming interlayer insulating films including a plurality of lower metal wiring extending therethrough over the semiconductor substrate in the pixel region and the peripheral circuit region; and then forming lower electrodes formed in the pixel region over the interlayer insulating film and electrically connected to the lower metal wiring formed in the pixel region; and then simultaneously forming an upper electrode in the pixel region over the interlayer insulating film and electrically connected to the metal wires formed in the pixel region and a photodiode in the pixel region over the interlayer insulating film and the upper electrode; and then forming a protective layer over the semiconductor substrate including the upper electrode and the interlayer insulating film in the peripheral circuit region, wherein the protective layer has a sloped portion in a region corresponding to a sidewall of the photodiode; and then forming via holes in the protective layer to expose the upper electrode and the metal wires in the peripheral circuit region; and then forming upper wiring over the protective layer including the via holes.

DRAWINGS

Example

DESCRIPTION

As illustrated in example FIGS. 1 to 7, a method for manufacturing an image sensor in accordance with embodiments may include forming first interlayer insulating film 111 and second interlayer insulating film 112 each including metal wires 121, 122 on and/or over semiconductor substrate 100. Semiconductor substrate 100 includes pixel region A and peripheral circuit region B. In pixel region A, transistor circuits may be formed in unit pixels so as to be connected to a later formed photodiode and to convert a received optical charge into an electrical signal. For example, the transistor circuits may be any one of 3Tr, 4Tr, and 5Tr. In peripheral circuit region B, transistor circuits may be formed to sequentially detect an electrical signal of each of the unit pixels of pixel region A to realize an image. First interlayer insulating film 111 and second interlayer insulating film 112 and metal wires 121, 122 may be formed on and/or over pixel region A and peripheral circuit region B so as to be connected to a power line or a signal line. First interlayer insulating film 111 and second interlayer insulating film 112 may be formed of a plurality of layers.

Figure 1:
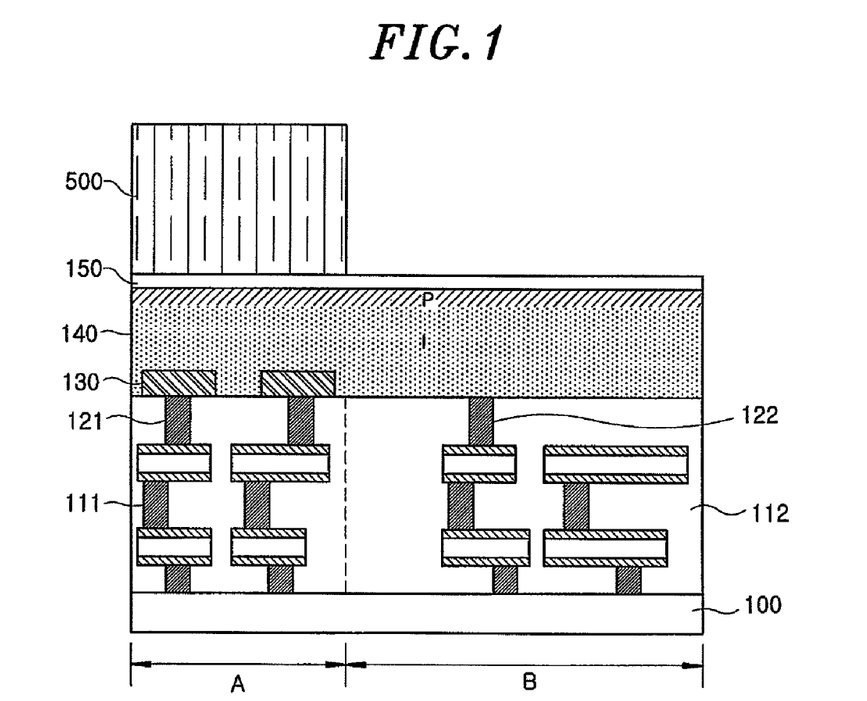
FIGS. 1 to 18 illustrate an image sensor and a process for manufacturing an image sensor in accordance with embodiments.

A plurality of metal wires 121, 122 may be formed penetrating through first interlayer insulating film 111 and second interlayer insulating film 112. Metal wires 121 formed in pixel region A are formed for each of the unit pixels so as to connect transistor circuits and photodiodes. Metal wires 122 of the peripheral circuit region B are formed so as to be connected to the transistor circuits. Interlayer insulating films 111, 112 may be formed of an oxide film or a nitride film. Metal wires 121 and 122 may be formed of various conductive materials including metal, metal alloys or silicide, i.e., aluminum, copper, cobalt, or tungsten.

Lower electrodes 130 are formed on and/or over metal wires 121 of pixel region A. Lower electrodes 130 may be formed of metal, such as Cr, Ti, TiW, and Ta. Thus, lower electrodes 130 may be electrically connected to metal wires 121 formed for each of the unit pixels. Of course, lower electrodes 130 may not be formed. Lower electrodes 130 may be formed as well on the metal wires 122 of the peripheral circuit region B.

Photodiode layer 140 is formed on and/or over interlayer insulating film 111 including lower electrodes 130. Photodiode layer 140 is also formed on and/or over second interlayer insulating film 112 of pixel region A to receive light incident from the outside, convert it into an electrical signal, and stores the same. An IP diode may be used for this purpose.

The IP diode is formed of a structure in which metal, an intrinsic amorphous silicon layer, and a p-type amorphous silicon layer are bonded together. The IP diode is an optical diode having a structure in which an intrinsic amorphous silicon layer, which is a pure semiconductor, is bonded between a p-type silicon layer and metal. The entire intrinsic amorphous silicon layer formed between the p-type and the metal becomes depletion regions, which is advantageous in the generation and storage of electrical charges. In accordance with embodiments, an IP diode is used as the photodiode, and the structure of the diode may be a P-I-N, N-I-P, or I-P structure. In accordance with embodiments, the intrinsic amorphous silicon layer will be referred to as an intrinsic layer, and the p-type amorphous silicon layer will be referred to as a conductivity type conducting layer. The formation of photodiode 140 will be described in more detail with reference to example FIGS. 1 and 2.

As illustrated in example FIG. 1, photodiode layer 140 which includes intrinsic layer I and conductivity-type conducting layer P is formed on and/or over interlayer insulating films 111, 112 including lower electrodes 130. For instance, intrinsic layer I is formed on and/or over interlayer insulating films 111, 112 including lower electrodes 130. Intrinsic layer I may serve as an intrinsic layer of an I-P diode in accordance with embodiments. Intrinsic layer I may be composed of intrinsic amorphous silicon and formed by chemical vapor deposition (CVD), PECVD or the like. For example, intrinsic layer I may be formed of amorphous silicon by PECVD using silane gas ($SiH_4$) or the like at a thickness in a range between approximately 10 to 1,000 times greater than the thickness of conductivity-type conducting layer P. The thickness differential is because the greater the thickness of intrinsic layer I, the greater depletion regions of a PIN diode, thereby making it advantageous to store and generate a large amount of optical charges. Further, an n-type conductivity type conducting layer may be formed before forming intrinsic layer I.

Conductivity-type conducting layer P is then formed on and/or over semiconductor substrate 100 including intrinsic layer I is formed. Conductivity-type conducting layer P may serve as a P layer of an I-P diode in accordance with embodiments. Meaning, conductivity-type conducting layer P may be a p-type conductivity type conducting layer, but is not limited thereto. For instance, conductivity-type conducting layer P may be formed using a p-doped amorphous silicon, but is not limited thereto. Conductivity-type conducting layer P may be formed by chemical vapor deposition (CVD), PECVD or the like. For example, conductivity-type conducting layer P may be formed of a p-doped amorphous silicon by PECVD using a gas mixture such as at least one of $BH_3$ and $B_2H_6$, in combination with silane gas ($SiH_4$).

Upper electrode layer 150 is then formed on and/or over photodiode layer 140 that is composed intrinsic layer I and conductivity-type conducting layer P. Upper electrode layer 150 may be formed of a transparent electrode having excellent light transmission and high conductivity. For instance, upper electrode layer 150 may be formed of any one of indium tin oxide (ITO), cardium tin oxide (CTO) and zinc oxide ($ZnO_2$). Photoresist pattern 500 corresponding to pixel region A is then formed on and/or over upper electrode layer 150.

Figure 2:
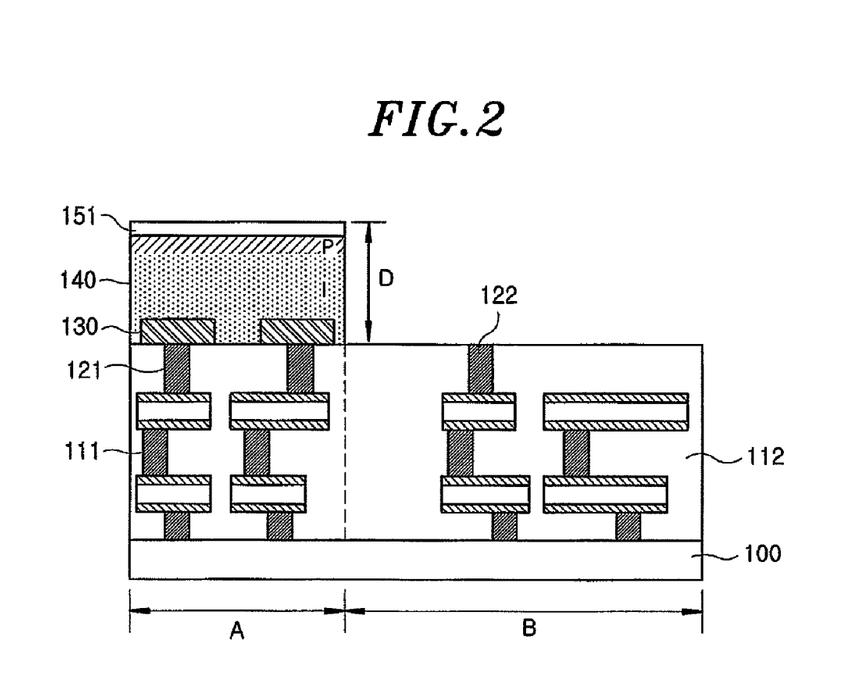

As illustrated in example FIG. 2, photodiode layer 140 and upper electrode layer 150 are then etched using photoresist pattern 500 as an etching mask to thereby simultaneously form photodiode 140 and upper electrode 151 only in pixel region A while also exposing metal wires 122 and interlayer insulating film 112 in peripheral circuit region B. As noted above, pixel region A and photodiode 140 form a vertical integration, thus making fill factors of photodiode 140 reach a level of 100%. Since photodiode 140 and upper electrode 151 are formed on and/or over interlayer insulating film 111 in pixel region A, stepped portion D is generated between the uppermost surface of upper electrode 151 and the uppermost surface of interlayer insulating film 112 in peripheral circuit region B. Further, sidewalls of upper electrode 151 and photodiode 140 may form a right angle or an acute angle with respect to the uppermost surface of interlayer insulating film 112 in peripheral circuit region B. In accordance with embodiments, a corner region contacting the sidewall of photodiode 140 and the uppermost surface of interlayer insulating film 112 forms the stepped portion. When the stepped portion is generated, it is difficult to deposit metal material therein when forming upper wiring 180 by a subsequent process. Particularly, there may be an occurrence of interruption in upper wiring 180 during formation. In order to avoid this, in accordance with embodiments, a spacer is formed on the sidewalls of photodiode 140 and upper electrode 151.

Figure 3:
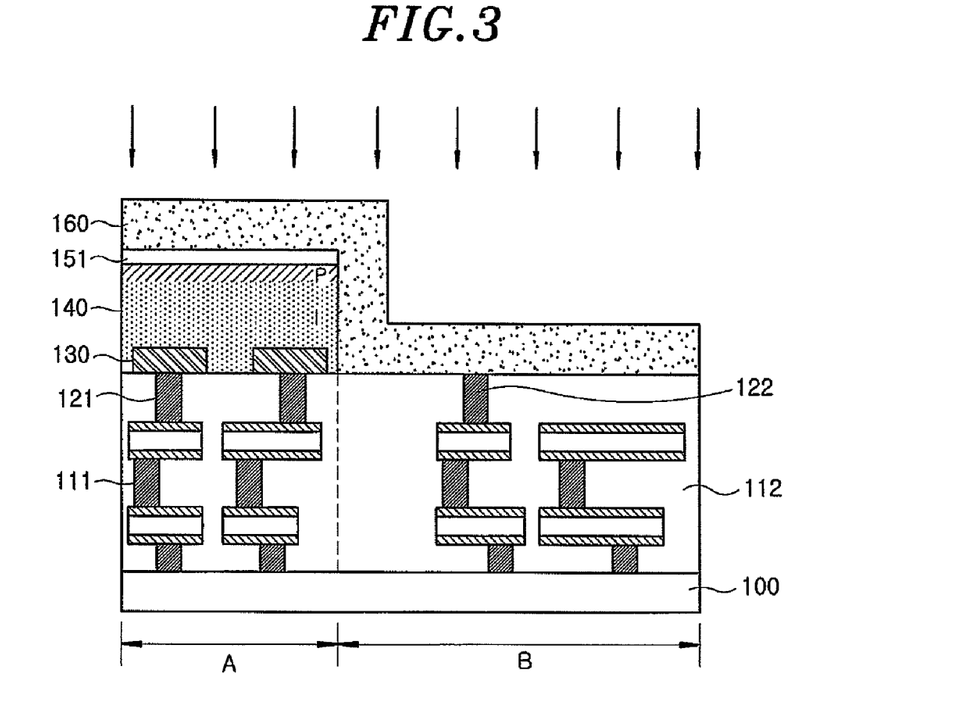

As illustrated in example FIG. 3, insulating layer 160 is formed on and/or over interlayer insulating films 111, 112 including photodiode 140 and upper electrode 151. Insulating layer 160 may be formed of any one of an oxide film, a nitride film, and a nitride oxide film. Insulating layer 160 may be formed of a low temperature oxide film at a temperature in a range between approximately 50 to 250° C. by a PVD process. Because insulating layer 160 is formed on and/or over the entire interlayer insulating film 112 including upper electrode 151, it is formed at a uniform thickness on and/or over the sidewalls of upper electrode 151 and photodiode 140. Accordingly, insulating layer 160 may have a stepped portion proportional to upper electrode 151 and interlayer insulating film 112 of peripheral circuit region B.

Figure 4:
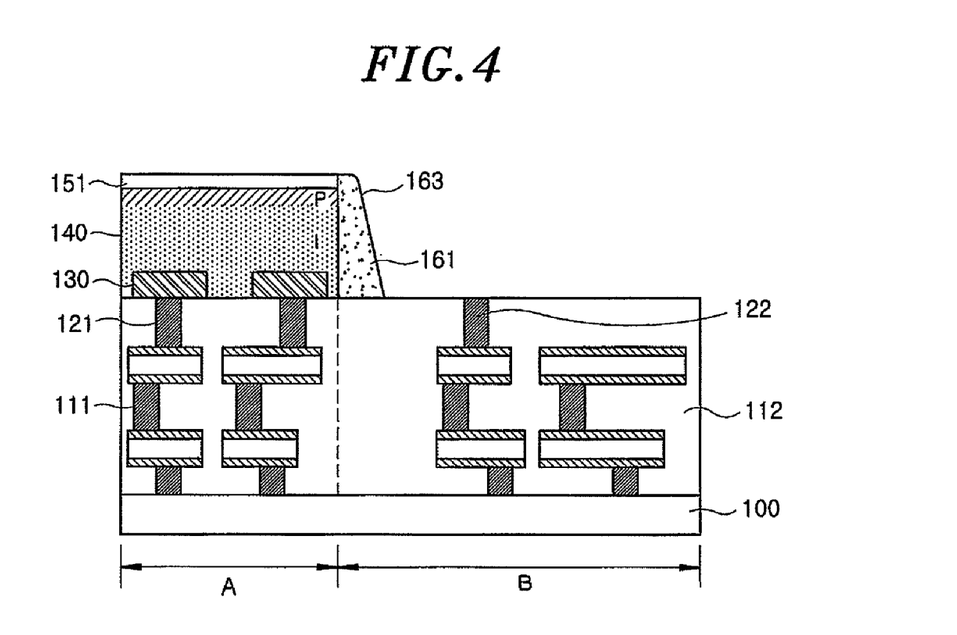

As illustrated in example FIG. 4, spacer 161 is formed on the sidewalls of photodiode 140 and upper electrode 151 by performing an etching process on the entire surface of insulating layer 160. For example, spacer 161 may be formed by plasma etching using $C_xF_y$ gas. Since spacer 161 is formed by performing an etching process on the entire surface of insulating layer 160, it can have wider region toward the lower portions of upper electrode 151 and photodiode 140 so as to be formed having a sloped shape. Therefore, sloped sidewall surface 163 of spacer 161 may be formed to have an obtuse angle with respect to the uppermost surface of interlayer insulating film 112 in peripheral circuit region B. Spacer 161 is formed only on the sidewalls of photodiode 140 and upper electrode 151, so that metal wires 122 and interlayer insulating film 112 in peripheral circuit region B are exposed.

Figure 5:
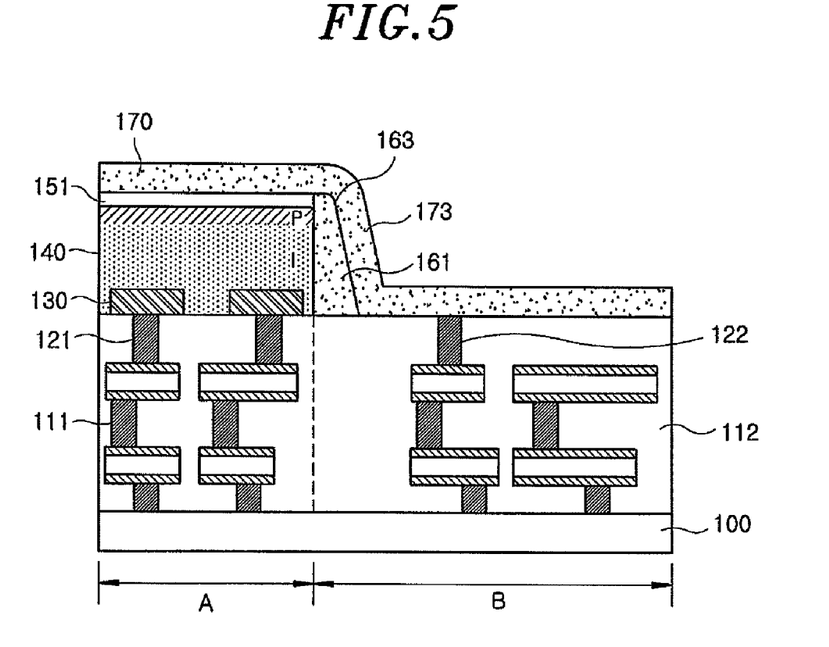

As illustrated in example FIG. 5, protective layer 170 is then formed on and/or over interlayer insulating films 111, 112 including photodiode 140, upper electrode 151 and spacer 161. Protective layer 170 may be formed of the same material as spacer 161. For example, protective layer 170 may be formed of a low temperature oxide film at a temperature in a range between approximately 50 to 250° C. by a PVD process. Protective layer 170 is formed to have a uniform thickness on and/or over interlayer insulating films 111, 112 including upper electrode 151 and spacer 161. Protective layer 170 may be formed having a first portion formed in pixel region A, a second portion formed in peripheral circuit region B and a third portion connecting the first and second portions to each other. Because it is formed on and/or over upper electrode 151, the uppermost surface of the first portion of protective layer 170 is on a plane above the plane of the uppermost surface of the second portion of protective layer 170. Moreover, since the third portion of protective layer 170 formed on and/or over spacer 161 is formed along sloped sidewall surface 163 of spacer 161, it may be formed as sloped portion 173. Sloped portion 173 of protective layer 170 may be formed having a smaller slope than sloped sidewall surface 163 of spacer 161.

Figure 6:
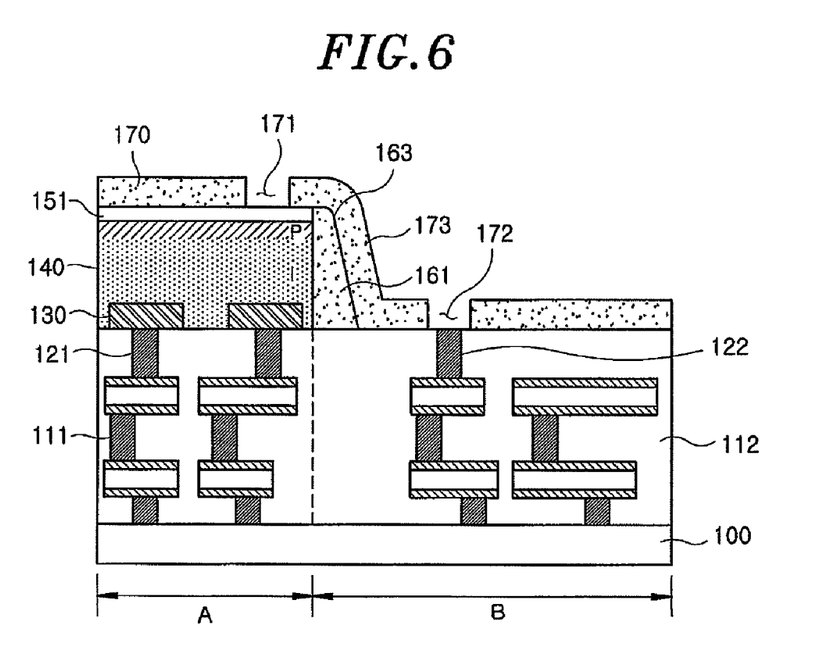

As illustrated in example FIG. 6, first and second via holes 171, 172 for exposing upper electrode 151 and metal wires 122 are formed in protective layer 170. First via hole 171 selectively exposes the surface of upper electrode 151 while second via hole 172 exposes metal wires 122 of peripheral circuit region B. First and second via holes 171, 172 may be selectively formed by an etching process after forming a photoresist pattern on and/or over protective layer 170.

Figure 7:
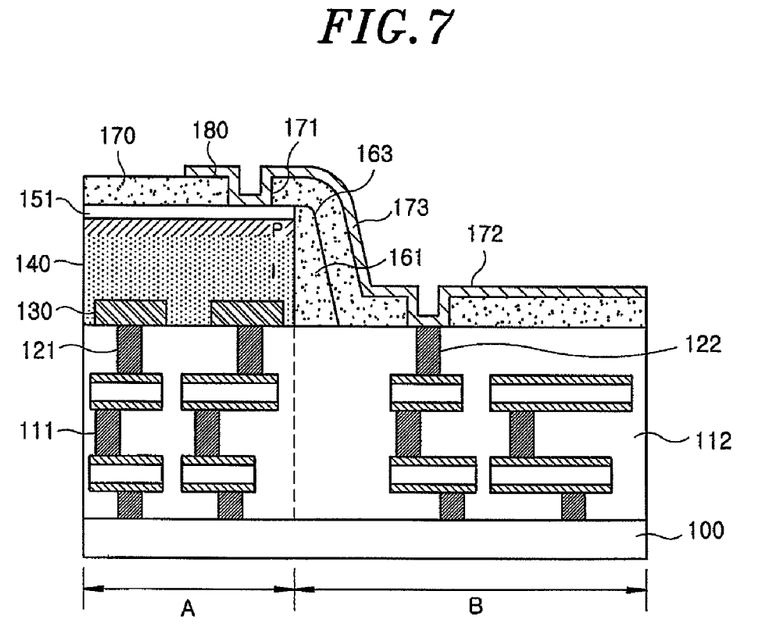

As illustrated in example FIG. 7, upper wiring 180 is then formed on and/or over protective layer 170 including first and second via holes 171, 172 and electrically connected to upper electrode 151 and metal wires 122 of the peripheral circuit region B through first and second via holes 171, 172. Upper wiring 180 may be deposited with a uniform thickness on and/or over protective layer 170 by performing a sputtering or CVD process on a metal material. Upper wiring 180 may be formed uniformly as well on and/or over protective layer 170 corresponding to the stepped portion of photodiode 140 and interlayer insulating film 112 in peripheral circuit region B. Meaning, sloped portion 173 of protective layer 170 formed on and/or over sloped sidewall surface 163 of spacer 161 forms an obtuse angle with the uppermost surface of interlayer insulating film 172, thus ensuring a wide space. Therefore, upper wiring 180 may be formed so as to be successively connected to protective layer 170 along first via hole 171, sloping portion 173 and second via hole 172. Further, upper wiring 180 may expose a portion of the first portion of protective layer 170 in pixel region A but cover the second portion of protective layer 170 in peripheral circuit B. At least one color filter and at least one microlens may be formed on and/or over the first portion of protective layer 170 in pixel region A.

Accordingly, as illustrated in example FIG. 7, an image sensor in accordance with embodiments may include semiconductor substrate 100 having pixel region A and peripheral circuit region B. In pixel region A, unit pixels including a photodiode are formed. In peripheral circuit region B, signal processing circuits of peripheral regions are formed. Interlayer insulating films 111, 112 including metal wires 121, 122 are arranged on and/or over semiconductor substrate 100. Interlayer insulating film 111 is formed on and/or over pixel region A while interlayer insulating film 112 is formed on and/or over peripheral circuit region B.

Metal wires 121 are formed for each of the unit pixels so as to be connected to the circuits of pixel region A. Metal wires 122 may be connected to the signal processing circuits of peripheral circuit region B. Lower electrodes 130 are disposed on and/or over interlayer insulating film 111 of pixel region A so as to be connected to metal wires 121 of the pixel region A, respectively. Photodiode 140 and upper electrode 151 are disposed on and/or over interlayer insulating film 111 of pixel region A including lower electrodes 130. Photodiode 140 includes intrinsic layer I and conductivity type conducting layer P. Upper electrode 151 may be formed only on and/or over the upper surface of photodiode 140. Sidewalls of photodiode 140 and upper electrode 151 have a high stepped portion with respect to the surface of interlayer insulating film 112 of peripheral circuit region B. The sidewalls of photodiode 140 and upper electrode 151 may be perpendicular to the uppermost surface of interlayer insulating film 112 of peripheral circuit region B.

Spacer 161 is disposed on and/or over sidewalls of photodiode 140 and upper electrode 151. Spacer 161 may be formed of a low temperature oxide film. Spacer 161 has a sloping sidewall surface 163 whose thickness gradually increases toward the lower portion of photodiode 140. Hence, due to spacer 161, the sidewall of photodiode 140 may have a sloped shape with respect to the surface of interlayer insulating film 112 of peripheral circuit region B. Meaning, the sidewall of spacer 161 and the uppermost surface interlayer insulating film 112 form an obtuse angle, thus ensuring a wide space.

Protective layer 170 is formed on and/or over pixel region A and peripheral circuit region B of semiconductor substrate 100 including upper electrode 151, photodiode 140, spacer 161, and interlayer insulating film 112. Protective layer 170 may be formed of a low temperature oxide film. Protective layer 170 is formed to cover all of upper electrode 151, photodiode 140, spacer 161 and interlayer insulating film 112. The uppermost surface of protective layer 170 corresponding to spacer 161 is formed to have sloping portion 173 corresponding to sloping sidewall 163 of spacer 161. Accordingly, protective layer 170 formed in the stepped portion corresponding to the sidewall of photodiode 140 and the uppermost surface of interlayer insulating film 112 forms an obtuse angle, thus ensuring a wide space. First via hole 171 and second via hole 172 are formed in protective layer 170 for selectively exposing upper electrode 151 and metal wires 122 of peripheral circuit region B.

Upper wiring 180 is disposed on and/or over protective layer 170 including first and second via holes 171 and 172. Upper wiring 180 may be successively formed on and/or over the surface of protective layer 170. Thus, upper wiring 180 is connected to upper electrode 151 through first via hole 171 and also connected to metal wires 122 of peripheral circuit region B through second via hole 172. Due to sloping portion 173 of protective layer 170, upper wiring 180 corresponding to the stepped portion of the sidewall of photodiode 140 and the surface of interlayer insulating film 112 may be successively formed without interruption.

In accordance with embodiments, vertical integration of transistor circuits and photodiodes may obtained, thereby making fill factors reach 100% by forming a photodiode of an IP structure on and/or over semiconductor substrate. In addition, the surface of the photodiode can be protected by forming a protective layer formed of a low temperature oxide film on and/or over the photodiode. Furthermore, the reliability of the device can be maximized by preventing interruption in a process of forming upper wiring by the spacer having a sloped sidewall formed on and/or over the sidewalls of the photodiode and the upper electrode.

Example FIGS. 8 to 14 illustrate an image sensor and a method for manufacturing an image sensor in accordance with embodiments. In explaining the image sensor and the method for manufacturing an image sensor, the same reference numerals and terminology are used for the same components as those illustrated and described in example FIGS. 1 to 7.

Figure 8:
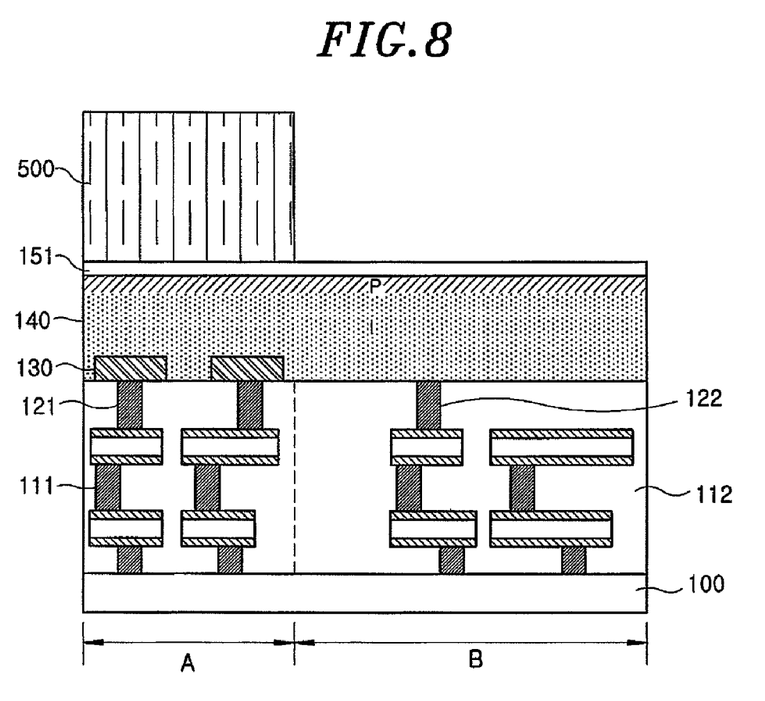

As illustrated in example FIG. 8, interlayer insulating films 111, 112 including metal wires 121, 122 is arranged on and/or over semiconductor substrate 100 having pixel region A and peripheral circuit region B. Lower electrodes 130 are formed on and/or over interlayer insulating film 112 in pixel region A and electrically connected to metal wires 122, respectively. Photodiode layer 140 and upper electrode layer 150 are then formed on and/or over interlayer insulating film 112 including lower electrode 130. The processes for forming interlayer insulating films 111, 112, metal wires 121, 122, lower electrode 130, photodiode layer 140 and upper electrode layer 150 is identical to that of illustrated and described in example FIGS. 1 to 7, and therefore, the description thereof will be omitted here.

Photoresist pattern 500 is formed on and/or over upper electrode layer 150 in pixel region A. Photoresist pattern 500 can cover the portion of upper electrode layer 150 in pixel region A and expose the portion of upper electrode layer 150 in peripheral circuit region B. Photoresist pattern 500 may be formed by the same process as that illustrated and described in example FIGS. 1 to 7.

Figure 9:
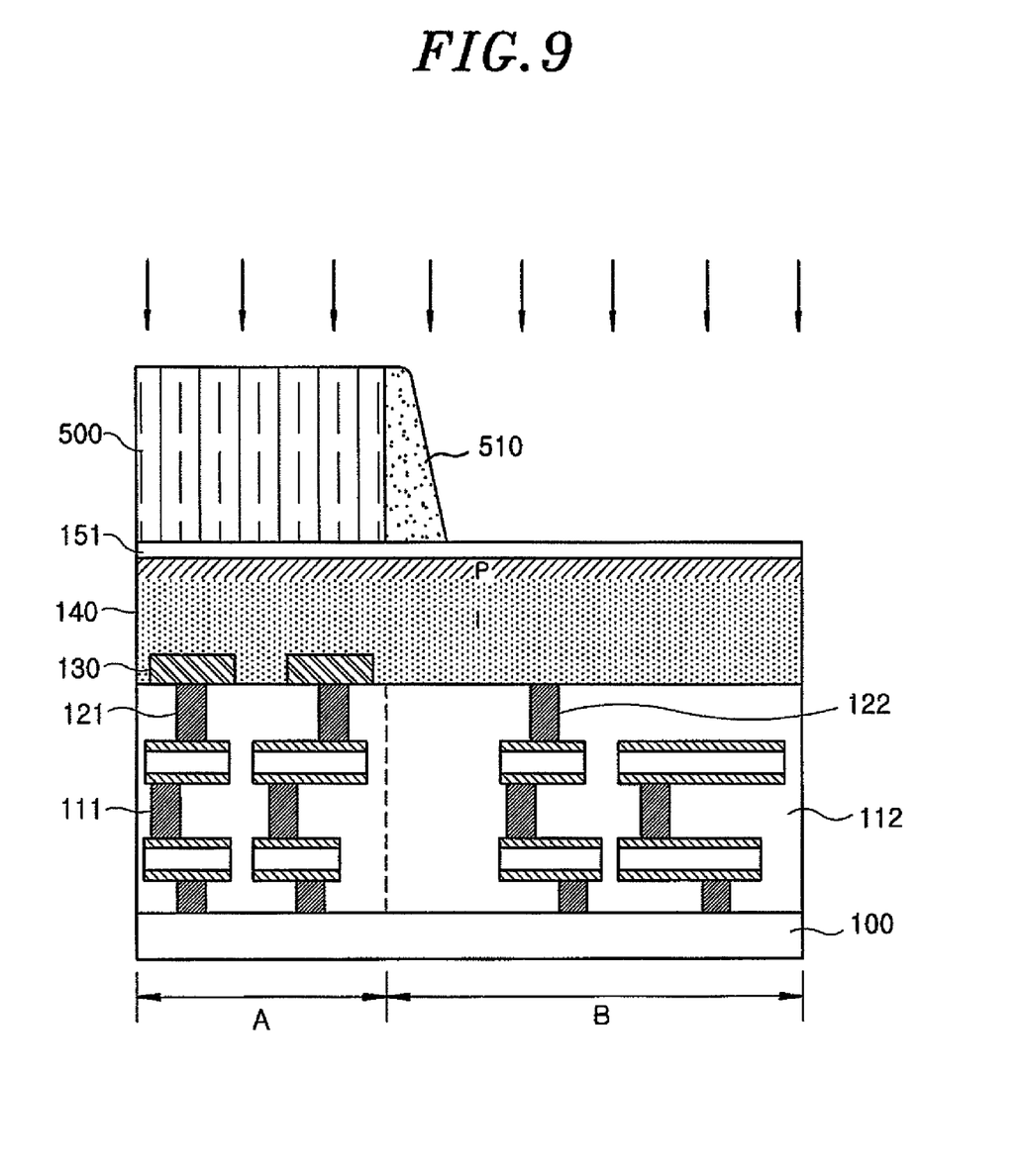

As illustrated in example FIG. 9, spacer 510 is formed on a sidewall of photoresist pattern 500 by performing a first etching process on upper electrode layer 150 and photodiode layer 140 using photoresist pattern 500 as an etching mask. The first etching process can be performed by using a $C_xF_y$ gas. In the first etching process, upper electrode layer 150 and photodiode layer 140 should maintain a high selection ratio with respect to photoresist pattern 500. For example, upper electrode layer 150 and photoresist pattern 500 may have a selection ratio of 1:10. Then, upper electrode layer 150 and photodiode layer 140 are not etched but a carbon polymer generated from the $C_xF_y$ gas is deposited on and/or over the sidewall of photoresist pattern 500. Thus, a polymer-based spacer 510 is formed on and/or over the sidewall of photoresist pattern 500. Spacer 510 is formed such that its surface area gradually increases at an upper portion thereof to a lower portion thereof.

Figure 10:
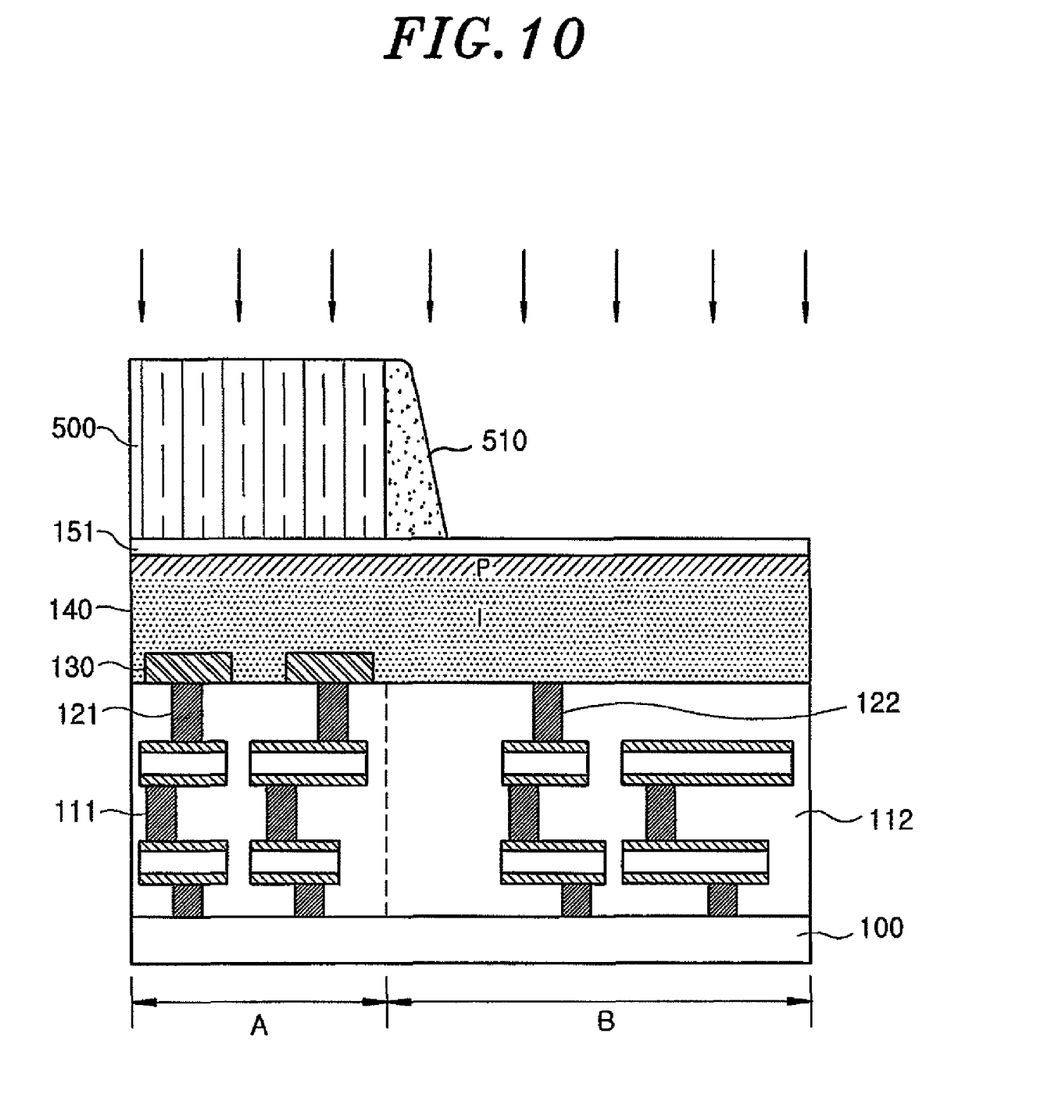

As illustrated in example FIG. 10, a second etching process is then performed on upper electrode layer 150 and photodiode layer 140 using photoresist pattern 500 and spacer 510 as etching masks. The second etching process may be done in succession with the first etching process. Meaning, the first etching process and the second etching process can be performed in-situ. The second etching process can be performed using HBr and $Cl_2$ gas.

Figure 11:
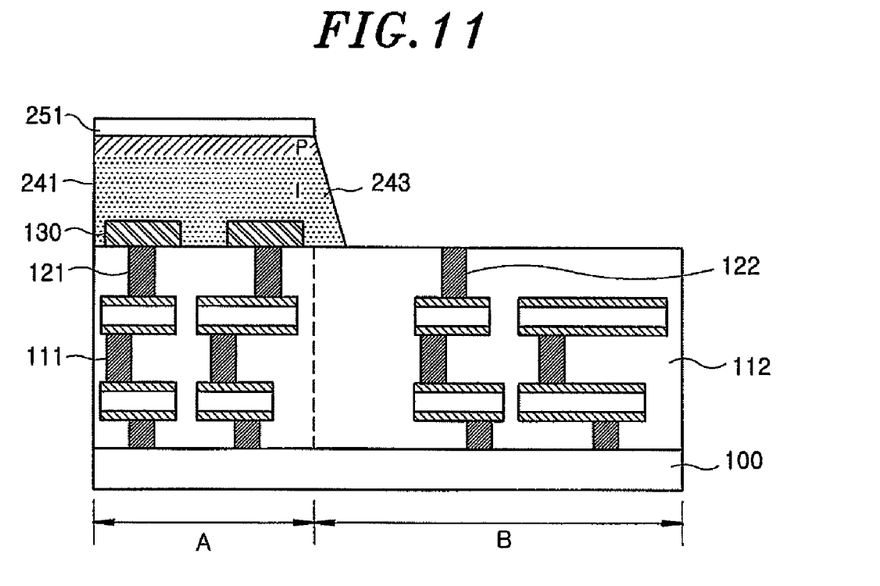

As illustrated in example FIG. 11, as a result of the second etching process, photodiode 241 and upper electrode 251 are formed in pixel region A and interlayer insulating film 112 and metal wires 122 are exposed in peripheral circuit region B. Because photoresist pattern 500 and spacer 510 are used as etching masks in the second etching process, a sidewall of photodiode layer 140 may be etched having the same shape as spacer 510. Accordingly, the sidewall of photodiode 241 may have sloped surface 243 which forms an obtuse angle with respect to the uppermost surface of interlayer insulating film 112.

Figure 12:
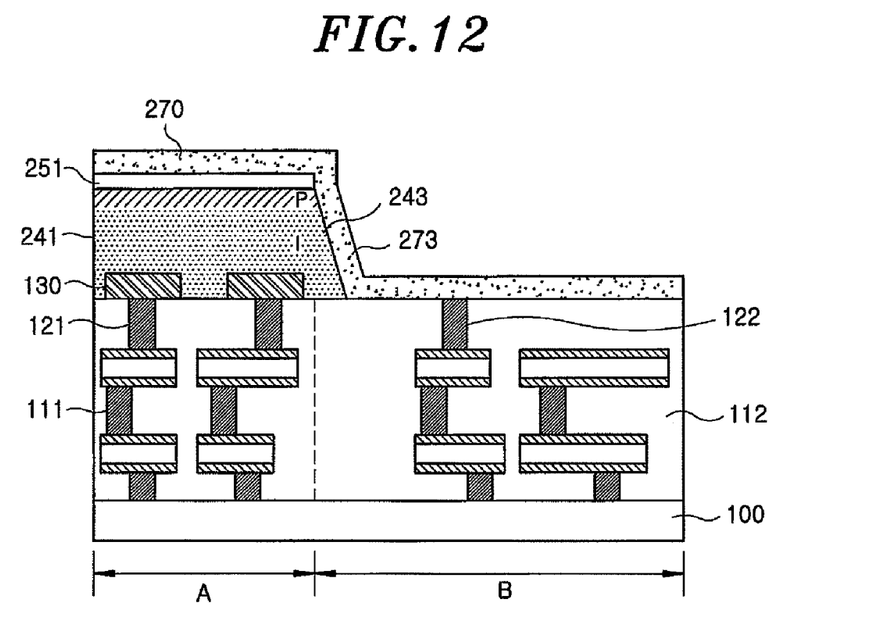

As illustrated in example FIG. 12, protective layer 270 is then formed on and/or over interlayer insulating films 111, 112 including upper electrode 251 and photodiode 241. Protective layer 270 may be formed of any one of an oxide film, a nitride film, and a nitride oxide film. Protective layer 270 may be formed of a low temperature oxide film at a temperature in a range between approximately 50 to 250° C. by a PVD process. Protective layer 270 is formed uniformly on and/or over the entire portion of interlayer insulating film 112 including upper electrode 251. Protective layer 270 may have a sloped portion 273 corresponding to sloped sidewall 243 of photodiode 241. Sloped portion 273 may have a less steep slope than sloped sidewall surface 243 of photodiode 241.

Figure 13:
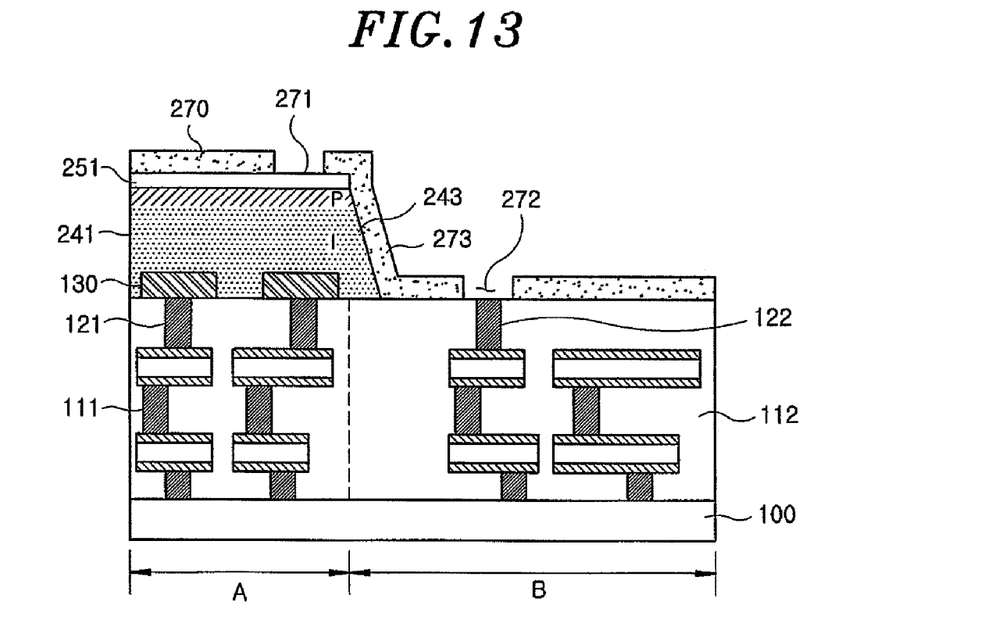

As illustrated in example FIG. 13, first and second via holes 271, 272 for exposing upper electrode 251 and metal wires 122 are formed on and/or over protective layer 270 by performing an etching process after forming a photoresist pattern on and/or over protective layer 270. First via hole 271 selectively exposes the surface of upper electrode 251 while second via hole 272 exposes metal wires 122 of peripheral circuit region B.

Figure 14:
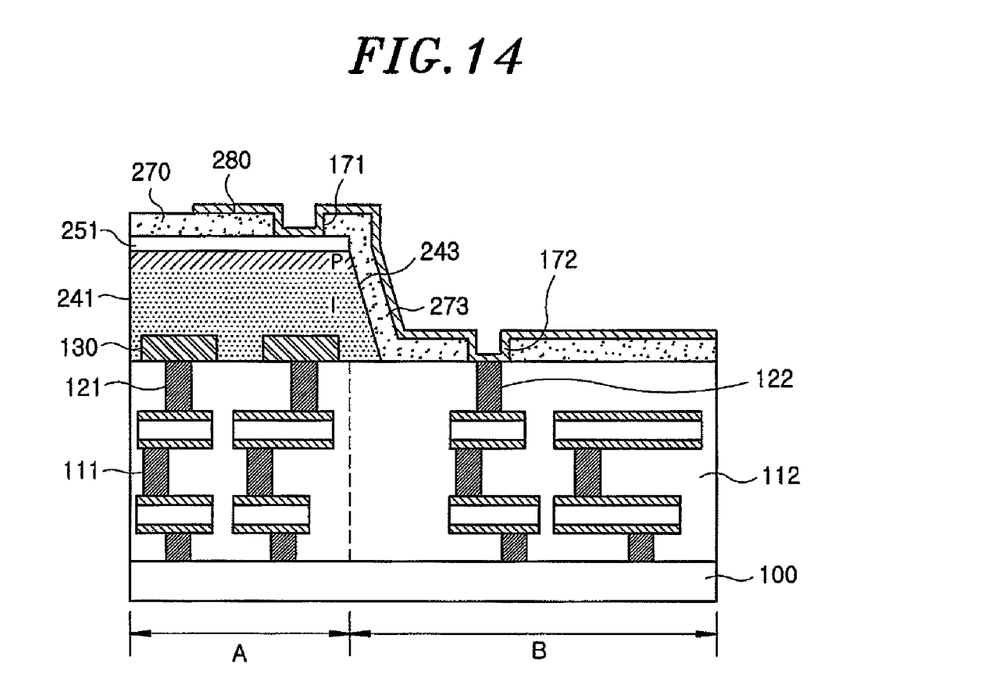

As illustrated in example FIG. 14, upper wiring 280 is then formed on and/or over protective layer 270 including first and the second via holes 271, 272. Upper wiring 280 is electrically connected to upper electrode 251 and metal wires 122 of peripheral circuit region B through first and the second via holes 271, 272. Upper wiring 280 may be deposited with a uniform thickness on and/or over protective layer 270 by a sputtering or CVD process on a metal material. Upper wiring 280 may be formed at a uniform thickness because it is formed on and/or over protective layer 270 having sloped portion 273. Sloped sidewall surface 243 of photodiode 241 forms an obtuse angle with respect to the uppermost surface of interlayer insulating film 112 of peripheral circuit region B. Since protective layer 270 is formed on and/or over the entire semiconductor substrate 100 including photodiode 241 and interlayer insulating film 112, the stepped portion of photodiode 241 and interlayer insulating film 112 can be alleviated. Moreover, sloped portion 273 of protective layer 270 forms an obtuse angle with respect to the uppermost surface of interlayer insulating film 112 due to sloped sidewall surface 243 of photodiode 241. Therefore, it is possible to ensure a wide space by sloped portion 273 of protective layer 270, and in turn, upper wiring 280 can be formed so as to be connected along the surface of protective layer 270 including first and the second via holes 271, 272. Further, upper wiring 280 may expose the first portion of protective layer 270 in pixel region A while covering the other portions in peripheral circuit region B. At least one color filter and at least one corresponding microlens may be formed on and/or over protective layer 270 of pixel region A.

Accordingly, as illustrated in example FIG. 14, image sensor in accordance with embodiments can include interlayer insulating films 111, 112 including metal wires 121, 122 formed on and/or over semiconductor substrate 100 having pixel region A and peripheral circuit region B. Metal wires 121 are formed for each of the unit pixels so as to be connected to the circuits of the pixel region A. Metal wires 122 may be connected to the signal processing circuits of peripheral circuit region B. Lower electrodes 130 are disposed on and/or over interlayer insulating film 111 of pixel region A and electrically connected to metal wires 121 of pixel region A, respectively. Photodiode 241 having sloped sidewall surface 243 and upper electrode 251 are disposed on and/or over interlayer insulating film 111 of pixel region A including lower electrodes 130. Photodiode 241 includes intrinsic layer I and conductivity type conductive layer P. Sloped sidewall surface 243 is formed at an obtuse angle with respect to the uppermost surface of interlayer insulating film 112 of peripheral circuit region B. Therefore, a wide space is ensured in a stepped portion of sloped sidewall surface 243 of photodiode 241 and the uppermost surface of interlayer insulating film 112.

Protective layer 270 is formed on and/or over semiconductor substrate 100 including upper electrode 251, photodiode 241 and interlayer insulating film 112. Protective layer 270 includes a sloped portion 273 corresponding to sloped sidewall surface 243 of photodiode 241. Sloped portion 273 of protective layer 270 formed in the stepped portion corresponding to sloped sidewall surface 243 of photodiode 241 and the uppermost surface of interlayer insulating film 112 forms an obtuse angle, thus ensuring a wide space. First and second via holes 271, 272 for selectively exposing upper electrode 251 and metal wires 122 of peripheral circuit region B are formed on and/or over protective layer 270. Upper wiring 280 is disposed on and/or over protective layer 270 including first and second via holes 271, 272. Upper wiring 280 is electrically connected to upper electrode 251 through first via hole 271 and electrically connected to metal wires 122 of peripheral circuit region B through second via hole 272. A portion of upper wiring 280 formed on and/or over sloped portion 273 of protective layer 270 permits formation of upper wiring 280 without interruption.

Example FIGS. 15 to 18 illustrate an image sensor and a method for manufacturing an image sensor in accordance with embodiments. In explaining the image sensor and the method for manufacturing an image sensor, the same reference numerals and terminology are used for the same components as those illustrated and described in example FIGS. 1 to 7.

Figure 15:
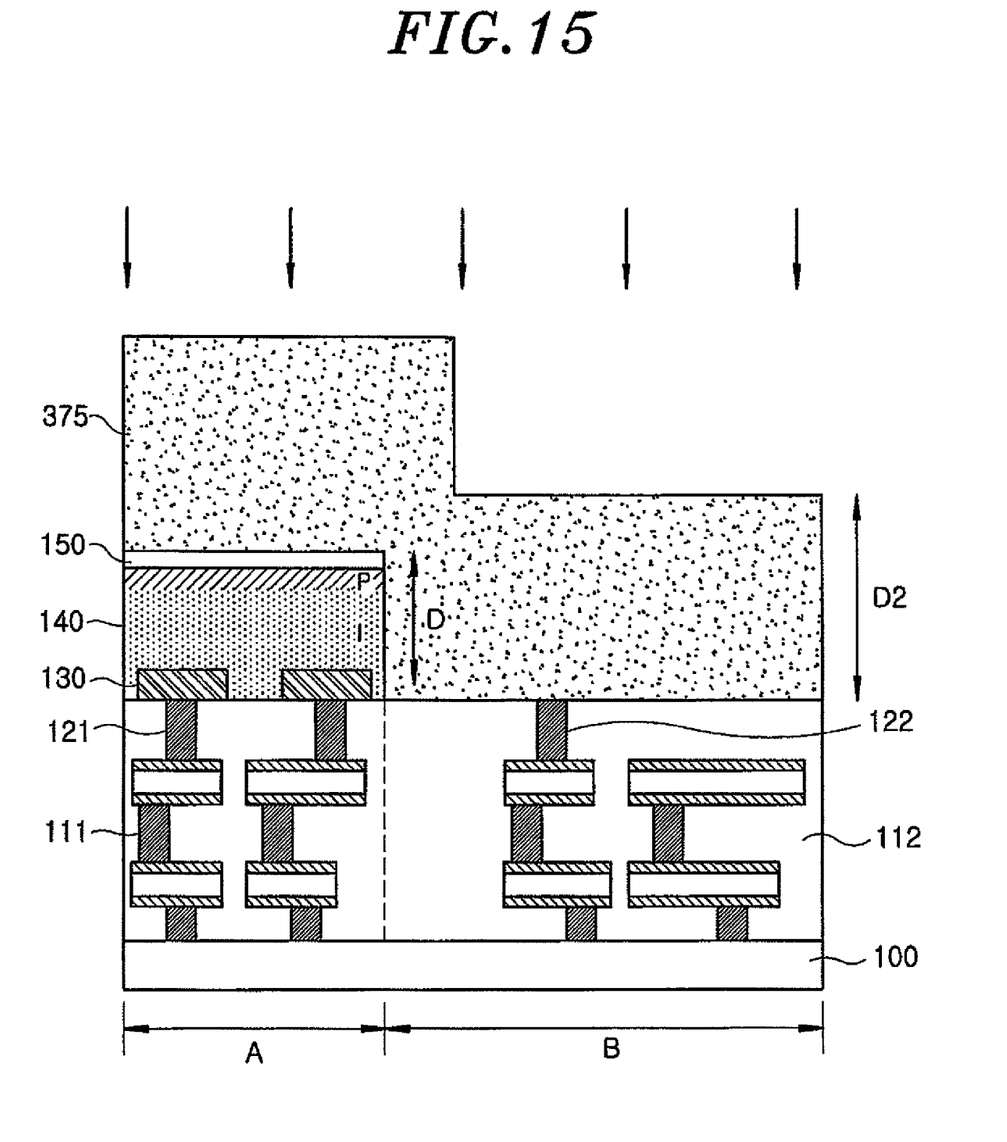

As illustrated in example FIG. 15, interlayer insulating films 111, 112 including metal wiring 121, 122 are arranged on and/or over semiconductor substrate 100 having pixel region A and peripheral circuit region B. Lower electrodes 130 are then formed on and/or over interlayer insulating film 112 corresponding to pixel region A so as to be electrically connected to metal wiring 122, respectively. Photodiode 140 and upper electrode 151 are formed on and/or over interlayer insulating film 111 corresponding to pixel region A. Interlayer insulating film 112 of peripheral circuit region B and metal wires 122 may be exposed. Since photodiode 140 and upper electrode 151 are formed on and/or over interlayer insulating film 112 of pixel region A, a stepped portion that includes the combined thicknesses of photodiode 140 and upper electrode 151 has a first height D1 is generated between upper electrode 151 and interlayer insulating film 112 of peripheral circuit region B. Protective film 375 is then formed on and/or over upper electrode 151, photodiode 140, and interlayer insulating film 112. Protective film 375 may be formed of any one of an oxide film, a nitride film, and a nitride oxide film. Protective film 375 may be formed of a low temperature oxide film at a temperature in a range between approximately 50 to 250° C. by a PVD process. A portion of protective film 375 formed in peripheral circuit region B may have second height D2 which is greater than first height D1 of stepped portion of photodiode 140 and upper electrode 151. Accordingly, protective film 375 is formed to cover all of upper electrode 151, photodiode 140, and interlayer insulating film 112.

Next, a wet etching process is performed on protective film 375. Protective film 375 may be wet-etched using a chemical solution such as HF or BOE. The etching process can be performed until protective film 375 has a remaining thickness in a range between approximately 10 to 1000 Å by adjusting the dosage of the chemical solution to be injected and the etching time. Then, protective film 375 may be isotropically etched using the wet etching method.

Figure 16:
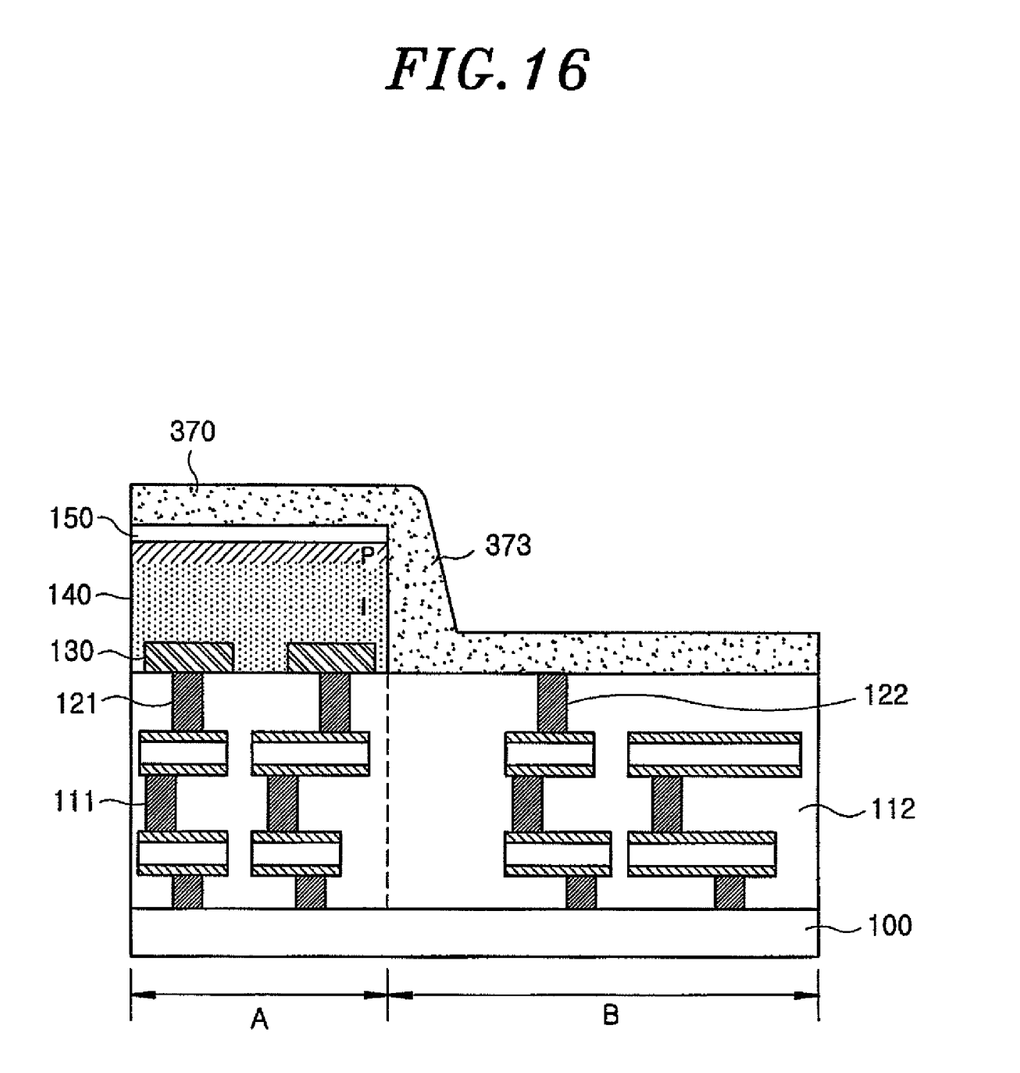

As illustrated in example FIG. 16, the wet etching process forms protective layer 370 on and/or over photodiode 140, upper electrode 151, and interlayer insulating films 111, 112. Protective layer 370 is formed to cover all of upper electrode 151, photodiode 140 and interlayer insulating films 111, 112. Because protective layer 375 is isotropically etched by wet etching, the sidewalls of protective layer 370 corresponding to the sidewall of photodiode 140 may have a sloped sidewall portion 373. Sloped sidewall portion 373 of protective layer 370 may be formed to have an obtuse angle with respect to the uppermost surface of interlayer insulating film 112 of peripheral circuit region B.

Figure 17:
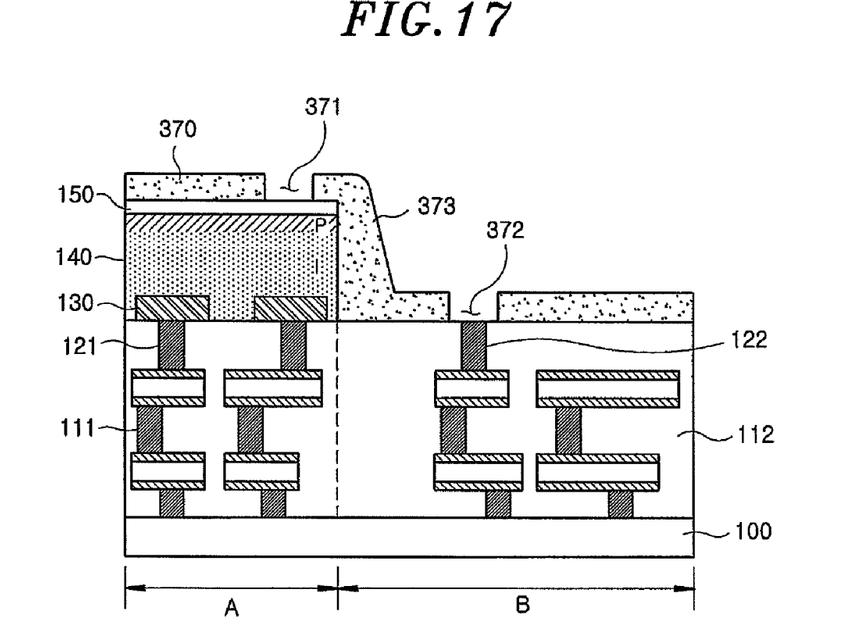

As illustrated in example FIG. 17, first and second via holes 371, 372 for exposing upper electrode 151 and metal wires 122 are formed on and/or over protective layer 370. First via hole 371 selectively exposes the surface of upper electrode 151 while second via hole 372 exposes metal wires 122 of peripheral circuit region B. First and the second via holes 371, 372 may be formed by an etching process after forming a photoresist pattern on and/or over protective layer 370.

Figure 18:
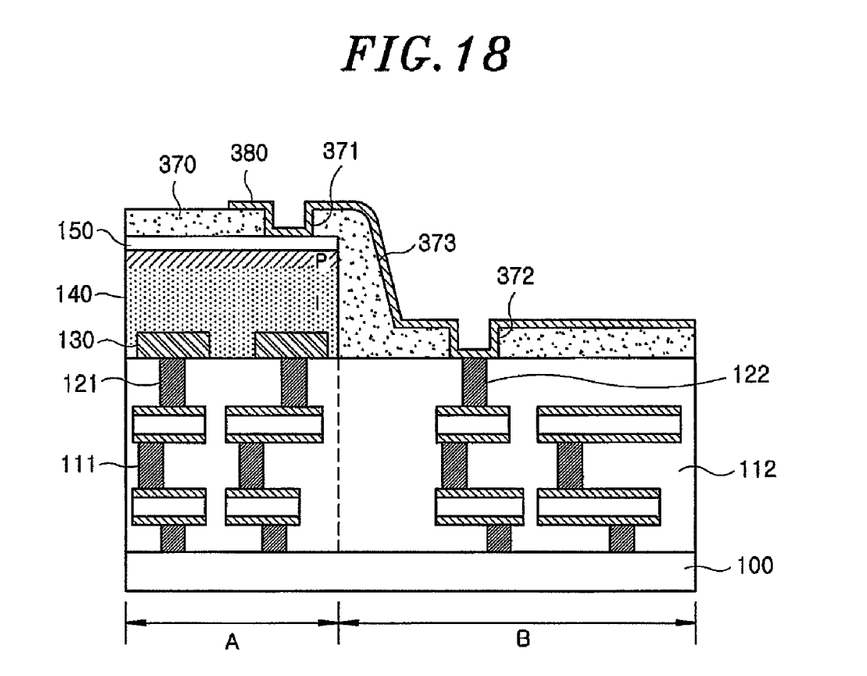

As illustrated in example FIG. 18, upper wiring 380 is formed on and/or over protective layer 370 including first and the second via holes 371, 372 and is electrically connected to upper electrode 151 and metal wires 122 of peripheral circuit region B through first and second via holes 371, 372. Upper wiring 380 may be deposited with a uniform thickness on and/or over protective layer 370 by a sputtering or CVD process on a metal material. Upper wiring 380 may be successively formed because it is formed on and/or over the surface of protective layer 370 having the sloping portion 373. Protective layer 370 corresponding to the sidewall of photodiode 140 has sloped sidewall portion 373, and thus, forms an obtuse angle with respect to the uppermost surface of interlayer insulating film 112 of peripheral circuit region B, thereby ensuring a wide space. Upper wiring 380 may be formed so as to be successively connected along the surface of protective layer 370 including first and second via holes 371, 372. Upper wiring 380 may expose a portion of the surface of protective layer 270 in pixel region A. Accordingly, at least one color filter and at least one corresponding microlens may be formed on and/or over protective layer 370 of pixel region A.

Accordingly, as illustrated in example FIG. 18, an image sensor in accordance with embodiments can include interlayer insulating films 111, 112 including metal wires 121 and 122 are arranged on and/or over semiconductor substrate 100 having pixel region A and a peripheral circuit region B. Metal wires 121 are formed for each of the unit pixels so as to be connected to the circuits of pixel region A and may be electrically connected to the signal processing circuits of peripheral circuit region B. Lower electrodes 130 are disposed on and/or over interlayer insulating film 111 of pixel region A and electrically connected to metal wires 121 of pixel region A, respectively. Photodiode 140 and upper electrode 151 are disposed on and/or over interlayer insulating film 111 of pixel region A including lower electrodes 130. Photodiode 140 includes intrinsic layer I and conductivity type conductive layer P. Upper electrode 151 may be formed only on and/or over photodiode 140. Thus, sidewalls of photodiode 140 and upper electrode 151 have a stepped portion perpendicular to the uppermost surface of interlayer insulating film 112 of peripheral circuit region B.

Protective layer 370 is formed on and/or over semiconductor substrate 100 including upper electrode 151, photodiode 140 and interlayer insulating film 112. Protective layer 370 is formed so as to cover all of upper electrode 151, photodiode 140, and interlayer insulating film 112. Protective layer 370 corresponding to photodiode 140 and upper electrode 151 is formed to have a sloped sidewall portion 373 corresponding to the stepped portion, such sloped sidewall portion 373 formed at an obtuse angle, thus ensuring a wide space. First and second via holes 371, 372 for selectively exposing upper electrode 151 and metal wires 122 of peripheral circuit region B are formed on and/or over protective layer 370. Upper wiring 380 is disposed on and/or over protective layer 370 including first and second via holes 371, 372. Upper wiring 380 may be successively formed on and/or over the surface of protective layer 370 and electrically connected to upper electrode 151 through first via hole 371 and metal wires 122 of peripheral circuit region B through second via hole 372. Since sloped sidewall portion 373 is formed on and/or over protective layer 370, upper wiring 380 corresponding to the stepped portion of the sidewall of photodiode 141 and the uppermost surface of interlayer insulating film 112 may be successively formed without interruption.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   a semiconductor substrate including a pixel region and a peripheral circuit region;
   interlayer insulating films including lower metal wiring formed over the pixel region and the peripheral circuit region;
   lower electrodes formed in the pixel region over the interlayer insulating film and electrically connected to the lower metal wiring formed in the pixel region;
   a photodiode formed in the pixel region over the interlayer insulating film and the lower electrodes;
   an upper electrode formed in the pixel region over the photodiode;
   a protective layer formed in the pixel region and the peripheral circuit region over the semiconductor substrate including the upper electrode and the interlayer insulating film, the protective layer having a sloped portion in a region corresponding to the sidewall of the photodiode;
   via holes formed in the protective layer to expose the upper electrode and the lower metal wiring in the peripheral circuit region; and
   upper wiring formed over the protective layer including the via holes.

2. The image sensor of claim 1, wherein the sidewall of the photodiode has a sloped surface.

3. The image sensor of claim 1, wherein a spacer is formed on the sidewall of the photodiode.

4. The image sensor of claim 3, wherein the protective layer and the spacer are formed of the same material.

5. The image sensor of claim 1, wherein the sloped portion of the protective layer is at an obtuse angle with respect to the uppermost surface of the interlayer insulating film in the peripheral circuit region.

6. An apparatus comprising:
   a semiconductor substrate having a pixel region and a peripheral circuit region;
   an interlayer insulating film formed in the pixel region and the peripheral circuit region;
   lower metal wiring formed extending through the interlayer insulating film in the pixel region and the peripheral circuit region;
   upper electrodes formed in the pixel region over the interlayer insulating film and electrically connected to the lower metal wiring;
   a photodiode formed in the pixel region over the interlayer insulating film and the upper electrode, the photodiode including an intrinsic layer formed over the upper electrodes and a conducting layer formed over the intrinsic layer;
   a protective layer formed in the pixel region over the upper electrode and in the peripheral circuit region over the interlayer insulating film;
   a first via hole formed in the protective layer exposing a portion of the upper electrode;

a second via hole formed in the protective layer exposing the lower metal wiring in the peripheral circuit region; and upper wiring formed over the protective layer including the via holes and electrically connected to the upper electrode and the lower metal wiring.

7. The apparatus of claim 6, wherein a portion of the protective layer in the peripheral circuit region is sloped in a region corresponding to the sidewall of the photodiode.

8. The apparatus of claim 6, wherein the protective layer in the peripheral circuit region has a sloped portion in a region corresponding to the sidewall of the photodiode, the sloped portion being formed at an obtuse angle with respect to the uppermost surface of the interlayer insulating film.

9. The apparatus of claim 6, further comprising spacer formed in the peripheral circuit region on the sidewall of photodiode, wherein the spacer has a sloped sidewall formed at an obtuse angle with respect to the uppermost surface of the interlayer insulating film.

10. The apparatus of claim 6, wherein the photodiode has a sloped portion formed at an obtuse angle with respect to the uppermost surface of the interlayer insulating film.

11. The apparatus of claim 6, wherein the upper electrode layer is composed of one of indium tin oxide (ITO), cardium tin oxide (CTO) and zinc oxide ($ZnO_2$).

12. The apparatus of claim 6, wherein the intrinsic layer comprises an intrinsic amorphous silicon layer and the conducting layer comprises a p-type amorphous silicon layer, the intrinsic amorphous silicon layer being formed at a thickness in a range between approximately 10 to 1,000 times greater than the thickness of the p-type amorphous silicon layer.

* * * * *